United States Patent [19]
Wanlass

[11] Patent Number: 5,391,896
[45] Date of Patent: Feb. 21, 1995

[54] MONOLITHIC MULTI-COLOR LIGHT EMISSION/DETECTION DEVICE

[75] Inventor: Mark W. Wanlass, Golden, Colo.

[73] Assignee: Midwest Research Institute, Kansas City, Mo.

[21] Appl. No.: 939,003

[22] Filed: Sep. 2, 1992

[51] Int. Cl.⁶ .................. H01L 31/12; H01L 31/16
[52] U.S. Cl. ........................... 257/80; 257/85; 257/89; 257/90; 257/440
[58] Field of Search .............. 257/80, 81, 84, 85, 257/89, 90, 184, 440; 372/50

[56] References Cited

U.S. PATENT DOCUMENTS

| | | | |
|---|---|---|---|
| 4,438,447 | 3/1984 | Copeland | 257/82 |
| 4,451,691 | 5/1984 | Fraas | 257/440 |
| 4,470,143 | 9/1984 | Kitamura | 372/50 |
| 4,577,207 | 3/1986 | Copeland | 257/90 |
| 4,653,058 | 3/1987 | Akiba | 372/50 |
| 4,788,690 | 11/1988 | Akiba | 372/50 |
| 4,801,993 | 1/1989 | Ankri | 372/50 |
| 4,815,090 | 3/1989 | Usami | 372/50 |
| 4,829,345 | 5/1989 | Ishioka | 257/82 |
| 4,906,583 | 3/1990 | Kagawa et al. | 257/76 |
| 4,963,949 | 10/1990 | Wanlass | 257/190 |

OTHER PUBLICATIONS

Sakai, S., et al, "Integrated Light Emitters and Photodetectors . . . " Sixth European Conference on Optical Communication. York, England (16–19 Sep. 1980) pp. 230–233.

*Primary Examiner*—Sara W. Crane
*Attorney, Agent, or Firm*—Ken Richardson; Edna M. O'Connor

[57] ABSTRACT

A single-crystal, monolithic, tandem, multi-color optical transceiver device is described, including (a) an InP substrate having upper and lower surfaces, (b) a first junction on the upper surface of the InP substrate, (c) a second junction on the first junction. The first junction is preferably GaInAsP of defined composition, and the second junction is preferably InP. The two junctions are lattice matched. The second junction has a larger energy band gap than the first junction. Additional junctions having successively larger energy band gaps may be included. The device is capable of simultaneous and distinct multi-color emission and detection over a single optical fiber.

2 Claims, 4 Drawing Sheets

MONOLITHIC MULTI-COLOR LIGHT EMISSION/DETECTION DEVICE

CONTRACTUAL ORIGIN OF THE INVENTION

The United States Government has rights in this invention under Contract No. DE-AC02-83CH10093 between the United States Department of Energy and the National Renewable Energy Laboratory, a Division of the Midwest Research Institute.

BACKGROUND OF THE INVENTION

1. Field of the Invention

The present invention relates, generally, to light-emitting devices and, more particularly, to light-emitting and detecting devices. Specifically, the present invention relates to improved monolithic devices which are capable of emitting and detecting light over a wide wavelength range. These devices are referred to as multi-color optical transceivers.

2. Description of the Prior Art

Optically coupled circuits and optical communication systems require high-efficiency light emitters and detectors which operate within a wavelength range which is suitable for the particular application. For fiber-optic communication systems utilizing silica fibers, the optimum wavelength range of interest is 1.0–1.5 µm (i.e., an energy range of 0.83–1.24 eV). In current systems the data transmission rate is limited by several factors including the inability of emission/detection devices to transmit/receive at more than a single wavelength. The monochromatic nature of present optical transceivers also results in complex optical interconnects because separate fibers are required for simultaneous transmission and reception.

Photovoltaic cells are known which essentially comprise semiconductors that have the capability of converting electromagnetic energy (such as light or solar radiation) directly to electricity. Such semiconductors are usually characterized by solid crystalline structures that have energy band gaps between their valence electron bands and their conduction electron bands. When light is absorbed by the material, electrons that occupy low-energy states become excited to cross the band gap to higher energy states. For example, when electrons in the valence band of a semiconductor absorb sufficient energy from photons of the solar radiation, they can jump the band gap to the higher energy conduction band.

Electrons which are excited to higher energy states leave behind them unoccupied low-energy positions or holes. Such holes can shift from atom to atom in the crystal lattice and thereby act as charge carriers, as do free electrons in the conduction band, and contribute to the crystal's conductivity. Most of the photons absorbed in the semiconductor give rise to such electron-hole pairs which generate the photocurrent and, in turn, the photovoltage exhibited by the cell.

As is known, the semiconductor is doped with a dissimilar material to form p-type and n-type materials, which can be then used to form p/n junctions. A voltage across the junction, which is the photovoltage, is produced when the semiconductor is exposed to light energy.

It is known that photon energies in excess of the threshold energy gap or band gap between the valence and conduction bands are usually dissipated as heat; thus they are wasted and do no useful work. More specifically, there is a fixed quantum of potential energy difference across the band gap in the semiconductor. For an electron in the lower energy valence band to be excited to jump the band gap to the higher energy conduction band, it has to absorb a sufficient quantum of energy, usually from an absorbed photon, with a value at least equal to the potential energy difference across the band gap.

The semiconductor is transparent to radiation which has photon energies less than the band gap. On the other hand, if the electron absorbs more than the threshold quantum of energy, e.g., from a higher energy photon, it can jump the band gap. The excess of such absorbed energy over the threshold quantum required for the electron to jump the band gap results in an electron that is higher in energy than most of the other electrons in the conduction band. The excess energy is eventually lost in the form of heat. The net result is that the effective photovoltage of a single band gap semiconductor is limited by the band gap.

Thus, in a single semiconductor solar cell, to capture as many photons as possible from the spectrum of solar radiation, the semiconductor must have a small band gap so that even photons having lower energies can excite electrons to jump the band gap. This, of course, involves attendant limitations. First, use of a small band gap material results in a low photovoltage for the device and, naturally, lower power output occurs. Second, the photons from higher energy radiation produce excess energy which is lost as heat.

On the other hand, if the semiconductor is designed with a larger band gap to increase the photovoltage and reduce energy loss caused by thermalization of hot carriers, then the photons with lower energies will not be absorbed. Consequently, in designing conventional single-junction solar cells, it is necessary to balance these considerations and try to design a semiconductor with an optimum band gap, realizing that in the balance there has to be a significant loss of energy from both large and small energy photons.

Much work has been done in recent years to solve this problem by fabricating tandem or multijunction (cascade) solar cell structures in which a top cell has a larger band gap and absorbs the higher energy photons, while the lower energy photons pass through the top cell into lower or bottom cells that have smaller band gaps to absorb lower energy radiation.

The band gaps are ordered from highest to lowest, top to bottom, to achieve an optical cascading effect. In principle, an arbitrary number of subcells can be stacked in such a manner; however, the practical limit is usually considered to be two or three. Multijunction solar cells are capable of achieving higher conversion efficiencies because each subcell converts solar energy to electrical energy over a small photon wavelength band over which it converts energy efficiently.

Various electrical connectivity options between subcells are possible, including (1) series connected, (2) voltage matched, and (3) independently connected. In the series connected type of tandem solar cells, there is current matching of the two subcells. The advantage of the independently connected type is that it avoids the problems of having to electrically connect the two subcells. This type also allows more possibilities in designing the solar cell. However, it is more complex with respect to fabrication of the solar cell, and it is also more complex in terms of delivering the power from each separate cell to a single electrical load. This is a systems problem.

Such tandem cells can be fabricated in two different manners. The first manner involves separately manufacturing each solar cell (with different band gaps) and then stacking the cells mechanically in optical series by any of a number of known methods. The disadvantage of this method is due to the complexity in forming such a stacked arrangement. The advantage is the flexibility of being able to stack different materials on top of each other.

The second manner of fabricating a tandem solar cell involves forming a monolithic crystalline stack of materials with the desired band gaps. The advantage of this method is the simplicity in processing. The disadvantage is that there are a limited number of materials combinations which can be epitaxially grown in device-quality form.

It has been generally accepted by persons skilled in the art that the desired configuration for monolithic multijunction tandem devices is best achieved by lattice matching the top cell material to the bottom cell material. Mismatches in the lattice constants create defects or dislocations in the crystal lattice where recombination centers can occur to cause the loss of photogenerated minority carriers, thus significantly degrading the photovoltaic quality of the device. More specifically, such effects will decrease the open-circuit voltage ($V_{oc}$), short circuit current ($J_{sc}$), and fill factor (FF). Thus, the lattice-matched monolithic approach provides an elegant manner for the construction of a high-quality tandem cell.

U.S. Pat. No. 4,829,345 describes an electronic device which includes a light transmission system for transferring signals between the circuit parts by the use of light. The device requires use of a superlattice structure to achieve multiple wavelength emission and detection of light.

It is known that similarities exist between the design and operational characteristics of solar cells, photodetectors and light-emitting diodes. However, there has not heretofore been provided a monolithic multi-color transceiver having the advantages and desirable combination of features which are exhibited by the devices of the present invention.

SUMMARY OF THE INVENTION

It is an object of the invention to provide a monolithic multi-color transceiver device which is highly efficient.

It is another object of the invention to provide a monolithic multi-color transceiver device which is capable of transmitting or receiving a number of distinct wavelengths simultaneously.

It is yet another object of the invention to provide a monolithic multi-color transceiver device comprising layers of InP and GaInAsP (or GaInAs).

It is yet another object of the invention to provide a monolithic multi-color transceiver device which is capable of transmitting and receiving several independent optical signals simultaneously for applications in optically coupled circuits and optical fiber communication systems.

It is yet another object of the invention to provide a monolithic transceiver device in which there are at least two lattice-matched layers.

It is still another object of this invention to provide a three-terminal monolithic multi-color transceiver device.

Additional objects, advantages, and novel features of the invention shall be set forth in part in the description that follows and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the monolithic multicolor transceiver device in one embodiment may comprise:

(a) an InP substrate having an upper surface;
(b) a base layer on the upper surface of the InP substrate; wherein the base layer comprises GaInAsP lattice-matched to InP;
(c) an emitter layer over said base layer, wherein said emitter layer comprises GaInAsP lattice-matched to InP (hereafter referred to as GaInAsP);
(d) optionally, a passivating layer over said emitter layer; wherein the passivating layer comprises InP;
(e) optionally, an InP base back-surface field layer;
(f) an InP base layer over said field layer;
(g) an InP emitter layer over said InP base layer.

The GaInAs (which could include GaInAsP) layer is lattice matched with the passivating layer. The InP base layer has a larger energy band gap than the GaInAsP base layer.

The monolithic multi-color transceiver device of the invention exhibits several advantages. It is a monolithic lattice-matched device structure which, in principle, can be made with as few as four distinct epitaxial layers. The band gap of the lower base layer can be tuned or designed without compromising lattice matching.

The technology for fabricating and handling InP and GaInAsP materials is well developed from applications in other electronic and optoelectronic devices, thus facilitating device processing.

Further, the transceiver device construction of this invention is preferably provided as a three-terminal device including a middle contact region. A lattice matched, monolithic, multi-color InP/GaInAs (or GaInAsP) light emission/detection device is provided which has several advantages over current monochromatic devices, including increased data transmission rates and simplified optical circuitry and networking.

With the device of this invention, transmission and reception at a number of distinct wavelengths simultaneously is possible on the same optical fiber, thus increasing the data transmission rate. Because the device of the invention is a monolithic device, it can be easily integrated into existing optical circuits and communications systems.

The multi-color capabilities of the present device enable a single optical medium to carry several independent optical signals simultaneously (transmitted or received), thus simplifying optical interconnects and networks. This translates to significant cost savings in equipment design.

BRIEF DESCRIPTION OF THE DRAWINGS

The accompanying drawings, which are incorporated in and form a part of the specification, illustrate the preferred embodiments of the present invention and, with the description, explain the principles of the invention. In the drawings.

DETAILED DESCRIPTION OF THE PREFERRED EMBODIMENTS

Figure 1:
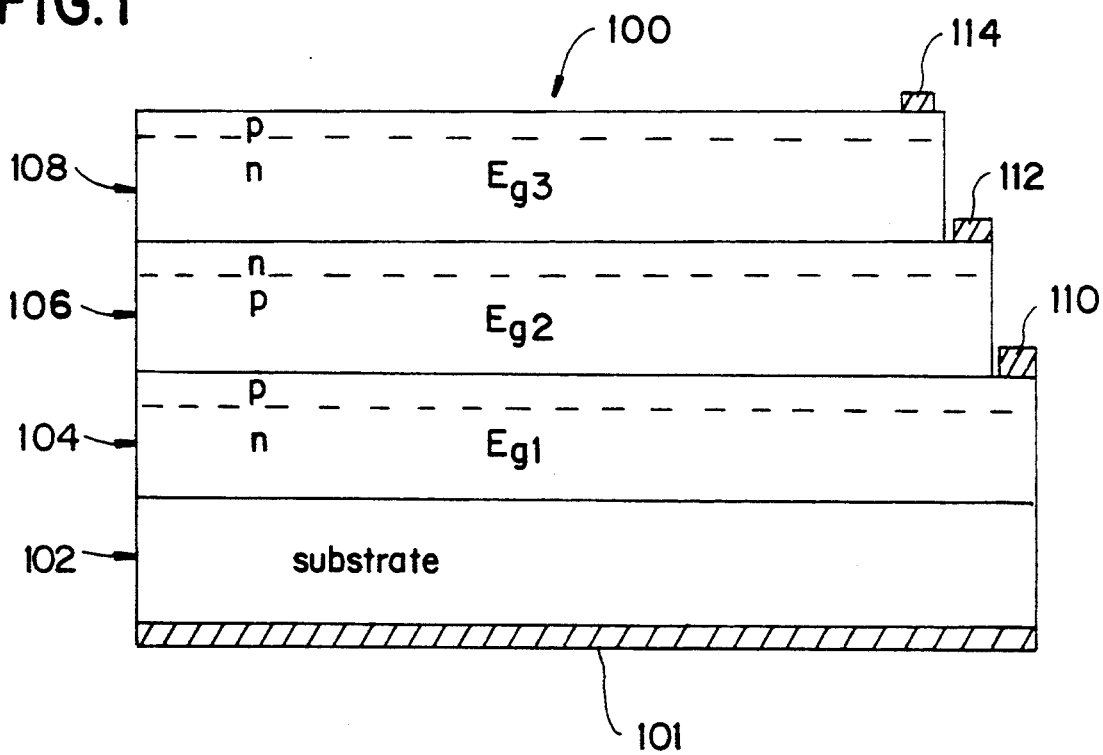
FIG. 1 is a side elevational view in schematic of a three junction, four terminal embodiment of monolithic multi-color optical transceiver of the invention.

FIG. 1 illustrates a typical monolithic optical transceiver device of this invention. The device 100 comprises a single-crystal base layer or substrate 102 (for example, it may be composed of n-InP, or silicon, or germanium, or gallium arsenide). Supported on the substrate are epitaxial layers or junctions 104, 106, and 108. The energy band gap increases from layer 104 to layer 106 and from layer 106 to layer 108. Preferably the junctions 104, 106 and 108 each comprise GaInAsP lattice-matched to InP.

The thicknesses of each of the layers shown in FIG. 1 may be, for example, about 3 to 6 microns. The band-gap energies of the various layers shown may range from about 0.7 eV to 1.35 eV. There are at least two layers or junctions in the device, and there may be many more (for example, as many as 10 or 20 junctions).

As illustrated in FIG. 1, the alternating junctions are of opposite polarity. In other words, the conductivity type of the base layer of junction 106 is the same as that of the emitter layer of junction 104. Also, the conductivity type of the base layer of junction 108 is the same as that of the emitter layer of layer 106. In this manner, the polarity of junction 106 is opposite that of junction 104. The polarity of junction 108 is also opposite that of junction 106. The same pattern and arrangement would be continued for subsequent additional junctions.

Optionally, a passivating layer may be included over the emitter layer in each junction. The passivating layer would be a lattice-matched crystalline material with a band gap energy greater than that of such emitter layer.

A low resistance ohmic electrical contact 110 is located above and near the interface between the emitter layer of junction 104 and the base layer of junction 106. Similarly, a low resistance ohmic electrical contact 112 is located above and near the interface between the emitter layer of junction 106 and the base layer of junction 108. Back conductive contact 101 is in contact with the lower surface of the substrate 102. Conductive contact 114 is in contact with the upper surface of junction 108.

Figure 2:
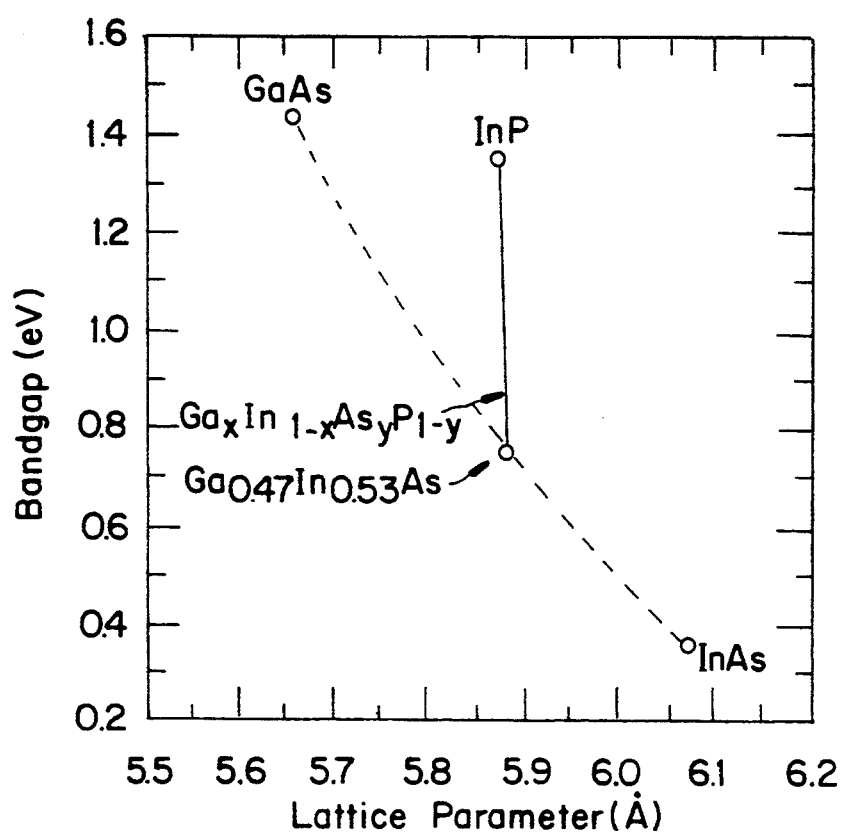
FIG. 2 shows the range of band gap energies available for GaInAsP alloys that are lattice-matched to InP.

The III-V pseudobinary, quaternary alloy $Ga_xIn_{1-x}As_yP_{1-y}$ is lattice matched to InP according to the following constraint on x and y $$y = 2.209x/(1+0.06864x)$$

where the endpoint compounds are InP and $Ga_{0.47}In_{0.53}As$, resulting in a family of semiconductors with band gaps which range from about 0.7 eV to 1.35 eV at room temperature, as shown in FIG. 2. The dependence of the band gap on x and y can be determined experimentally (hereafter, $Ga_xIn_{1-x}As_yP_{1-y}$ with compositions defined by the above constraint which yield a desired (defined) band gap will be referred to as GaInAsP), where x is in the range of 0 to 0.467 and y is in the range of 0 to 1.00. Thus, lattice matched, monolithic, multilayer structures of GaInAsP or InP substrates are possible with a tunable band gap within the individual layers. Furthermore, the band gaps possible with GaInAsP lattice matched to InP cover the optimum range for silica optical fibers. Therefore, an optimum monolithic multicolor optical emitter/detector can be produced using the GaInAsP/InP materials system.

Lattice matched, epitaxial layers of GaInAsP can be grown on InP substrates using a technique such as organo-metallic vapor phase epitaxy (MOVPE) using trimethylindium, trimethylgallium, phosphine and arsine as the primary reactants and with diethylzinc and hydrogen sulfide as the doping sources.

In its most general form, the optical transceiver consists of layers of GaInAsP containing p/n homojunctions grown on an InP substrate with the band gap in each layer increasing from bottom to top in the monolithic stack. The band gap in each layer can be tuned to emit/detect at a desired wavelength through an appropriate choice of GaInAsP composition. In this configuration, a particular junction (layer) can transmit and receive independently since each of the layers above it are transparent to its operating wavelength. Furthermore, each upper adjacent layer has a higher band gap and, therefore, provides a minority carrier confinement barrier for the lower junction emitter layer, thus increasing light output and detection efficiency.

Operation and fabrication of the device is simplified by alternately reversing the polarity of the p/n junctions in each of the GaInAsP layers and applying electrodes to the common n- or p-type regions between adjacent junctions. Correct placement of individual electrical contacts is facilitated by using existing selective wet chemical etching techniques. Using such a structure, selective emission/detection from each of the junctions can be achieved. The circuitry required for selective operation of the junctions will depend on the number of junctions and desired operating mode (i.e., it is application specific).

Figure 3:
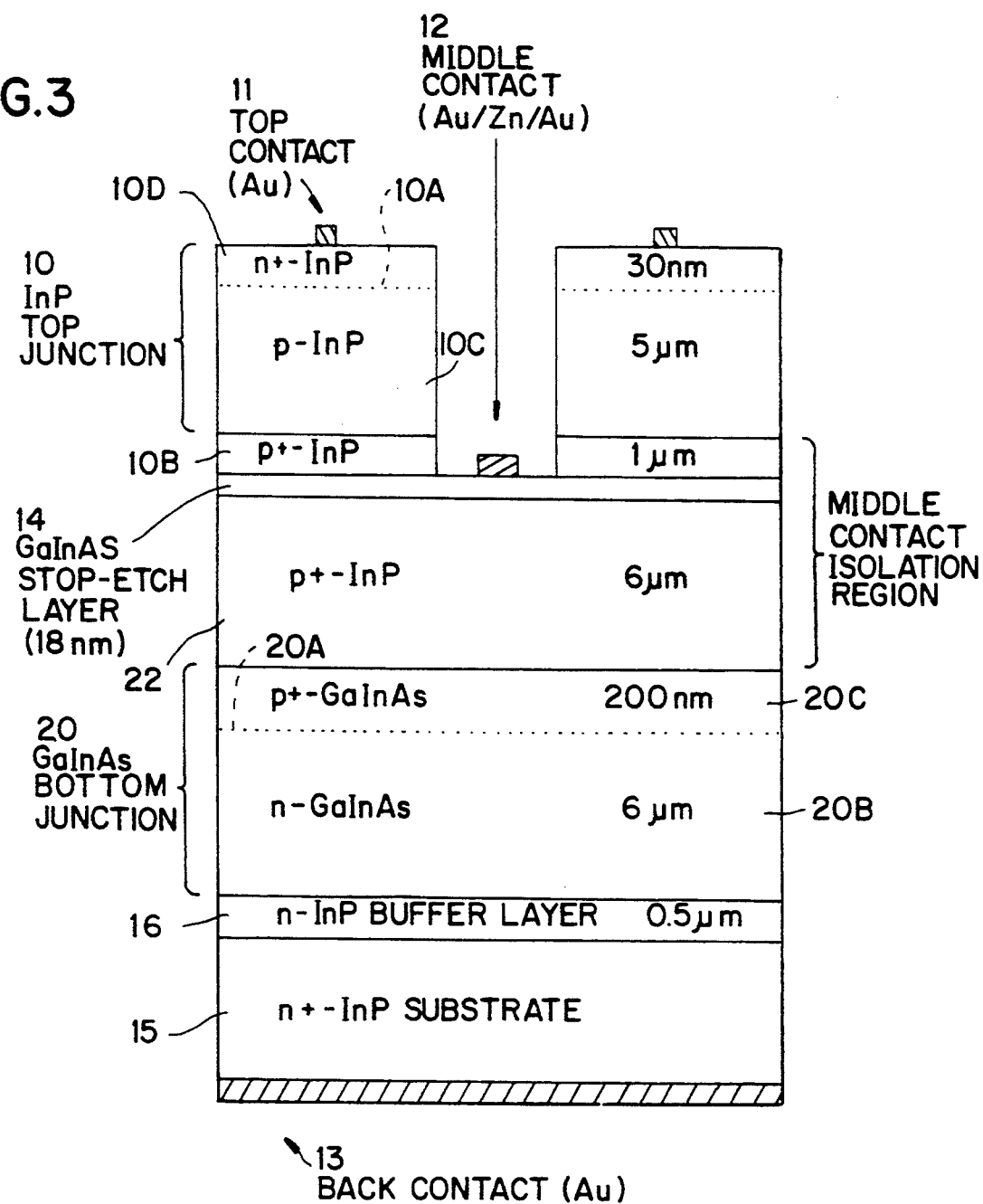
FIG. 3 is a side elevational view in schematic of a two junction, three terminal embodiment of monolithic prototype device of the invention.

FIG. 3 illustrates one preferred embodiment of a monolithic, two-junction, three-terminal, tandem multicolor optical transceiver device of the invention. It comprises a monolithic combination of diodes in epitaxial layers of GaInAs and InP grown epitaxially on a single-crystal InP substrate.

This device includes an InP upper junction 10 which includes a homojunction 10A. The device also includes a GaInAs or GaInAsP bottom junction 20 that includes a homojunction 20A. Under the bottom junction 20, there is an InP substrate 15.

The stop-etch layer 14 shown in the drawing may not be necessary, but it could be used to facilitate processing during manufacture of the device shown. The conductive passivating layer 22 is optional.

Top conductive contact 11 is supported by the upper surface of the InP emitter layer, as illustrated, and is low resistance and ohmic electrically. Back conductive contact 13 is in contact with the lower surface of the InP substrate and is low resistance and ohmic electrically. Middle contact 12 is supported by the stop-etch layer 14 and is low resistance and ohmic electrically. Contacts 11, 12 and 13 may be gold, for example, without annealing.

Wet chemical etching of the middle contact trough and the mesa isolation troughs is accomplished using the 10H$_2$SO$_4$:1H$_2$O$_2$/Concentrated HCl system (both at room temperature) which etches the InP/GaInAs materials system selectively (10H$_2$SO$_4$:1H$_2$O$_2$:1H$_2$O etches GaInAs at approximately 0.8 μm min.). Likewise, concentrated HCl etches InP at about 8 μm min.$^{-1}$ and attacks GaInAs at 25 nm min.$^{-1}$). The use of a thin GaInAs stop-etch layer in combination with the selective etching system makes correct placement of the middle contact in the structure a relatively straightforward procedure, and still allows for high transmission of sub-InP band gap photons to and from the GaInAs junction.

Each junction includes photoactive regions. For example, the photoactive regions of junction 10 include the n+-InP upper region and a portion of the p-InP lower region directly below the n+/p junction. The photoactive region of junction 20 includes both p+- and n-type regions thereof. The lower region of junction 10 and the upper region of junction 20 are of common conductivity type. Thus, as illustrated in FIG. 3, the lower region of junction 10 and the upper region of junction 20 are both p-type. Of course, if desired, both of said regions could instead be n-type (i.e., for p/n/p devices). The ohmic middle contact 12 is placed between the photoactive regions of both junctions in the common p-type region.

The substrate 15 is illustrated in the drawings as an InP substrate. InP is an attractive III-V semiconductor for a variety of electronic device applications because of its electronic and optoelectronic properties. Among the main disadvantages associated with the use of the material as a substrate, however, are the high cost, fragility, and high mass density of InP.

Substrate 15 may be composed essentially of InP, or it may be a thin layer of InP on another semiconductor material, or it may be any of the alternative substrate structures as defined in U.S. Pat. No. 4,963,949 incorporated herein by reference. Said patent describes techniques for growing device quality InP on foreign substrates while minimizing the propagation of dislocations into the InP layer. Such techniques enable a low-cost, lightweight substrate structure having good strength to be used for an InP-based semiconductor device. Accordingly, such techniques can be used in the preparation of substrate structures which are useful in the present invention.

The bottom or lower junction 20 is grown on the upper surface of InP substrate 15 epitaxially. Additionally, the composition of the material is controlled such that the material of the junction is lattice matched to the InP. The upper or top junction 10 is grown on the upper surface of the lower junction epitaxially. Also, the composition of the material is controlled such that the InP top junction is lattice matched to the lower junction. Thus, a single-crystal lattice matched monolithic tandem optical transceiver is obtained.

The InP buffer layer 16 forms a minority carrier mirror for the back surface of the n-GaInAs base layer 20B. The p+-GaInAs layer 20C is an emitter layer. The InP intermediate layer 22 serves to passivate the GaInAs emitter layer and also provides a conductive pathway for lateral current flow to the middle contact from both junctions. The stop-etch layer 14 facilitates proper placement of the middle contact through the use of selective wet chemical techniques. The p+-InP back-surface field layer 10B enhances minority carrier confinement in the InP base layer 10C. The upper InP layer 10D is an emitter layer.

If desired, an antireflection coating may be placed on top of the device to improve light output and light detection.

The upper junction has a larger energy band gap than the lower junction. The energy band gap for the upper junction is 1.35 eV at 300K. The energy band gap of the lower junction may be varied by changing the composition of the GaInAsP junction.

Although the device in FIG. 3 is illustrated as comprising an upper junction of the n/p type and a lower junction of the p/n type, the opposite configuration is considered to be a functional equivalent thereof.

The thickness of the lower junction may vary, but generally it will be in the range of about 3 to 6 microns. The thickness of the upper junction may also vary, but generally it will be in the range of about 3 to 6 microns. The thickness of the substrate 15 is preferably in the range of about 300 to 600 microns.

For n-type doping, it is known to use conventional extrinsic impurities such as, for example, sulfur, tellurium, or selenium. For p-type doping, it is known to use elements such as zinc, cadmium, beryllium, or magnesium.

The middle contact isolation region includes a heavily doped layer of p-type InP and a heavily doped p-type layer of GaInAs. The p-type InP layer is referred to as a lateral conduction layer (LCL) because it allows for lateral conduction of current from both junctions to the common middle contact. The p-type GaInAs layer 14 serves two purposes: (1) It is a stop-etch layer (SEL) which terminates the etching of the trenches through the InP top junction layers. This function is necessary in order to place the middle contact 12 at the desired position within the tandem structure. (2) It also provides a low contact resistance for the middle contact 12.

The middle contact region serves a very important function for the device. It reduces the high series resistance which would otherwise produce junction coupling effects.

Simultaneous two-color light emission using the device of FIG. 3 was demonstrated by applying an appropriate DC forward bias to each of the junctions thereby inducing electroluminescence. The luminescence was measured at room temperature using a monochromator and a germanium (Ge) detector. The relative signals from each of the junctions was corrected for the response of both the monochromator and the detector.

Figure 4:
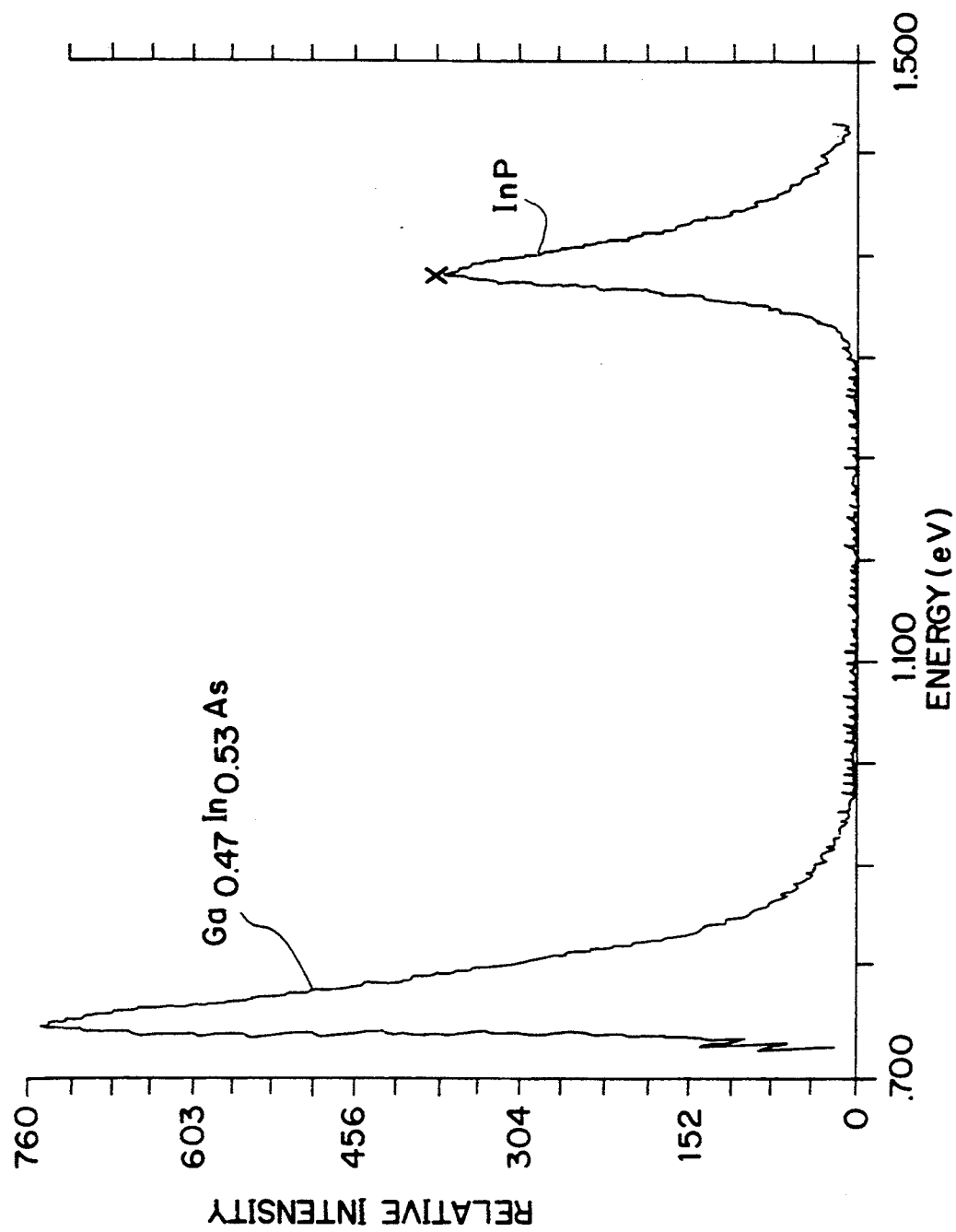
FIG. 4 is a graph illustrating electroluminescence spectra for the two junction, three terminal device illustrated in FIG. 3.

An example of the luminescence spectra from the device of FIG. 3 is given in FIG. 4. Simultaneous two-color emission is clearly demonstrated with the peak positions corresponding to the band gaps of InP and GaInAs. Some coupling of the luminescence output from each of the junctions was observed as the individual bias levels were adjusted, an effect which can be attributed to the resistance of the common middle terminal. The coupling effect can be reduced by lowering the resistance associated with the middle terminal.

Figure 5:
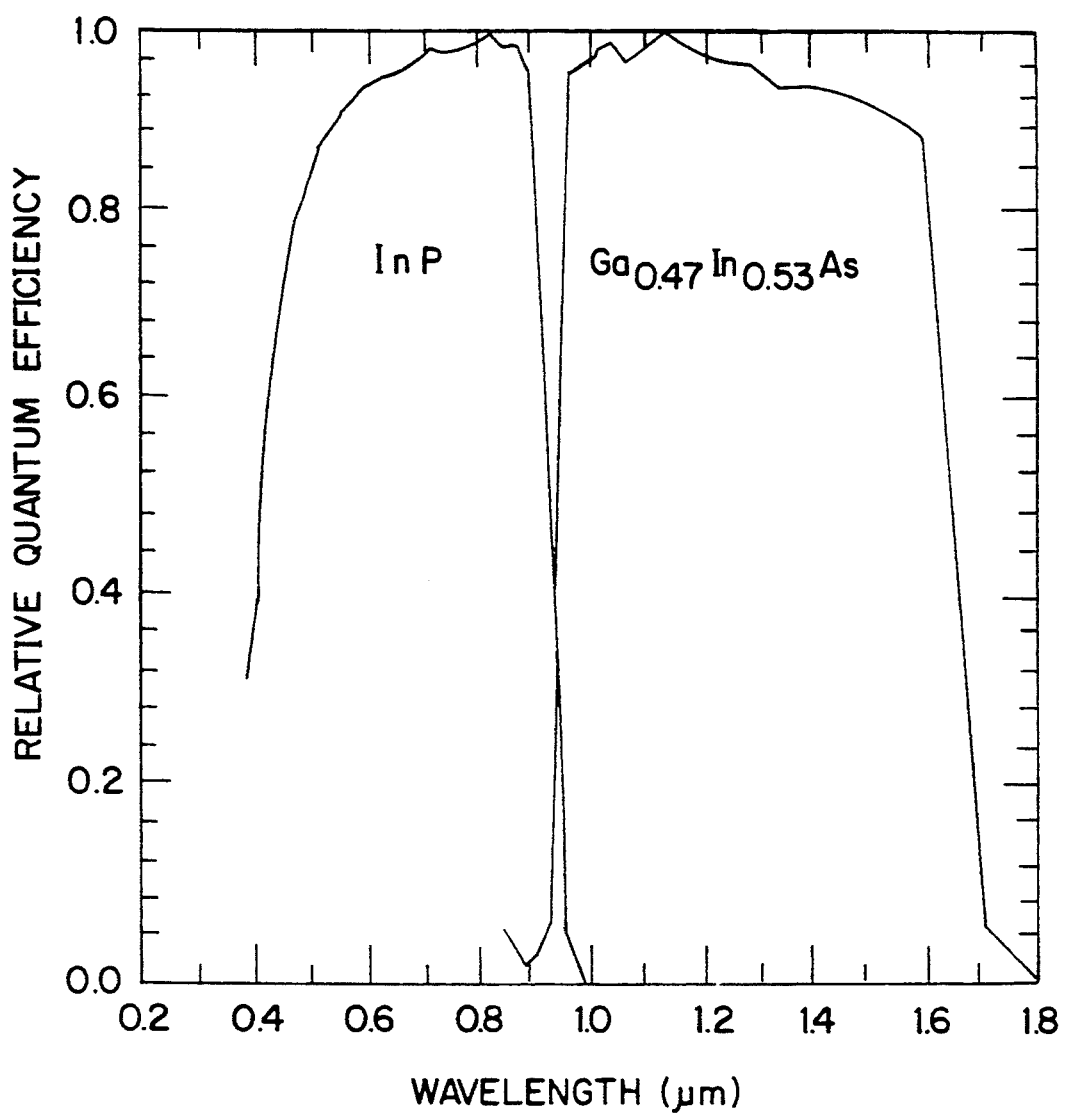
FIG. 5 is a graph illustrating quantum efficiency data for the two junction optical transceiver of the type shown in FIG. 3.

Composite relative quantum efficiency data for the prototype device are given in FIG. 5. The data illustrate two important features regarding the device quality and operational characteristics. Both junctions show high relative response near their respective band edges; this is an important characteristic for efficient detection of light emission from a twin device. The high near-band-edge response also indicates high-quality material. Furthermore, the wavelength ranges over which the junctions respond are clearly distinct due to complete optical filtering provided by the InP layers on the GaInAs layers. Thus, a pair of identical devices can communicate simultaneously over a single optical fiber at two distinct wavelengths without any ambiguity or cross-talk. In other words, simultaneous and distinct two-color emission and detection have been demonstrated with the optical device of FIG. 3.

The multi-color optical transceiver devices of the invention can be packaged in any suitable or appropriate manner to facilitate integration into desired optical networks or circuits. For example, one or more devices could be mounted on a chip, or they could be connected to optical fibers, etc., as desired.

The foregoing is considered as illustrative only of the principles of the invention. Further, because numerous modifications and changes will readily occur to those skilled in the art, it is not desired to limit the invention to the exact construction and operation shown and described, and accordingly all suitable modifications and equivalents may be resorted to falling within the scope of the invention as defined by the claims which follow.

The embodiments of the invention in which an exclusive property or privilege is claimed are defined as follows:

1. A monolithic multi-color optical transceiver device comprising:
   (a) a single-crystal substrate having upper and lower surfaces;
   (b) a first junction comprising:
      (1) a first base layer on said upper surface of said substrate; said first base layer comprising GaInAsP lattice-matched to InP;
      (2) a first emitter layer over said first base layer; wherein said first emitter layer comprises GaInAsP lattice-matched to InP;
   (c) a passivating layer over said first junction; wherein said passivating layer has a band gap energy greater than that of said first emitter layer;
   (d) a stop-etch layer over said passivating layer, wherein said stop-etch layer comprises GaInAs:
   (e) a second junction comprising:
      (1) a second base layer on said passivating layer; wherein said second base layer comprises GaInAsP lattice-matched to InP; wherein the band gap energy of said second base layer is greater than that of said first base layer; wherein said second base layer is of a conductivity type which is the same as that of said first emitter layer;
      (2) a second emitter layer over said second base layer; wherein said second emitter layer comprises GaInAsP lattice-matched to InP;
   (f) low resistance ohmic electrical contacts in electrical communication with each of said first and second base layers;
   (g) at least one additional junction over said second junction; wherein each said additional junction includes a base layer and an emitter layer; wherein said base layer of each said additional junction has a band gap energy greater than the next lower base layer; and wherein the base layer of each said additional junction is of a conductivity type which is the same as that of the adjacent emitter layer.

2. An optical transceiver in accordance with claim 1, further comprising a low resistance ohmic electrical contact in electrical communication with said lower surface of said substrate.

* * * * *